United States Patent [19]

Goldberg et al.

[11] Patent Number: 4,905,252

[45] Date of Patent: Feb. 27, 1990

[54] RING LASER CAVITIES

[75] Inventors: Lew Goldberg, Alexandria, Va.; Joseph F. Weller, Fort Washington, Md.

[73] Assignee: United States of America as represented by the Secretary of the Navy, Washington, D.C.

[21] Appl. No.: 245,176

[22] Filed: Sep. 16, 1988

[51] Int. Cl.[4] ............................................. H01S 3/083
[52] U.S. Cl. ...................................... 372/94; 372/108; 372/98; 372/19
[58] Field of Search ...................... 372/18, 99, 50, 49, 372/19, 108, 98

[56] References Cited

U.S. PATENT DOCUMENTS

| 4,255,717 | 3/1981 | Scrifres et al. | 372/24 |
| 4,686,485 | 8/1987 | Goldberg et al. | 372/18 |
| 4,751,711 | 6/1988 | Welch et al. | 372/18 |

OTHER PUBLICATIONS

L. Goldberg et al. "Injection Locking and Single-Mode Fiber Coupling of a 40-Element Laser Diode Array", Appl. Phys. Lett. 50 (24), 15 Jun. 1987, pp. 1713–1715.
L. Goldberg et al. "Single Lobe Operation of a 40-Element Laser Array in an External Ring Laser Cavity", Appl. Phys. Lett. 51 (12), 21 Sep. 1987, pp. 871–873.
D. F. Welch et al. "Single-Lobe 'Y' Coupled Laser Diode Arrays", Electronics Letters, 12th Mar. 1987, vol. 23, No. 6, pp. 270–272.
C. J. Chang-Hasnain et al., "High Power With High Efficiency in a Narrow Single-Lobed Beam From a Diode Laser Array in an External Cavity", Appl. Phys. Lett. 50 (21), 25 May 1987, pp. 1465–1467.

Primary Examiner—Leon Scott, Jr.
Attorney, Agent, or Firm—Thomas E. McDonnell; A. David Spevack; Andrew M. Lesniak

[57] ABSTRACT

Diffraction limited, single narrow lobe radiation from a large area laser is achieved in a system using an external ring laser cavity to return radiation to the laser via a spatial filter and a Faraday rotator. An antireflectance coating of sufficiently small reflectivity added to the large area laser converts it into a laser amplifier which provides optical gain in a ring laser cavity.

23 Claims, 4 Drawing Sheets

RING LASER CAVITIES

BACKGROUND OF THE INVENTION

1. Field of the Invention

This invention describes ring laser cavities which incorporate optical amplifiers to generate and amplify light which is propagating in the ring. The invention more particularly relates to ring laser cavities where light is amplified by a large area optical amplifier and the spatial and spectral properties of the amplifier emission are controlled using optical elements in the cavity.

2. Background Information

Large active area lasers, such as coupled-stripe laser diode arrays having many narrow stripes are able to generate much greater radiation power than single narrow stripe laser diodes. Broad-stripe laser diodes can generate much more radiation power than can typical narrow stripe laser diodes. Both the arrays and the broad stripe diodes are called large area lasers because of their large active area, which accounts for their high radiation powers.

Undesirable characteristics of large area lasers limit their usefulness. The radiation from these lasers is wide lobed rather than narrow lobe and the spectrum of the emission is multilongitudinal mode rather than mono-longitudinal mode. These characteristics prevent their use in applications such as coherent optical communications where narrow optical spectrum and diffraction limited beam focusing are required.

The wide-lobed pattern of the emission in either case causes the laser emission to be especially undesirable. The shape makes it impossible to efficiently couple the radiation from the large-area laser into a single mode optical fiber and makes it impossible to achieve a diffraction-limited collimated beam needed in free space propagation communication systems.

Single mode and single diffraction limited lobe operation of a large area laser (i.e. a coupled-stripe laser array or a broad single stripe laser diode) is required for many laser source applications which benefit from the high output power of such a laser.

Previously, several methods for achieving single narrow diffraction limited lobe emission from large area laser diodes have been proposed but all of them have deficiencies which prevent a highly successful application. These methods are discussed in the following references: Welch, D. F. et al. "Single Lobe 'Y' coupled laser diode arrays", Electron. Lett., V. 23, p. 270 (1987); Goldberg, L. et al., U.S. Pat. No. 4,686,485 (1987); Goldberg, L. et al., "Single lobe operation of a 40-element laser array in an external ring laser cavity", Appl. Phys. lett. V. 51, p. 871 (1987); Goldberg, L. et al., "Injection locking and single mode fiber coupling of a 40-Element laser diode array", Appl. Phys. Lett., V. 50, p. 1713 (1987); and Chang-Hasnein, C. J., et al. "High power with high efficiency in a narrow single lobed beam from a diode laser array in an external cavity", Appl. Phys. Lett., V. 50, p. 1465 (1987).

One method offers array designs resulting in highest laser optical gain for the lowest order spatial mode. This method is described in the above-referenced paper by Welch. In this method all array elements operate with the same phase. These designs, however, produce arrays emitting in a single lobe pattern only at relatively low power (less than 200 milliwatts in continuous wave operation) and emitting in a double lobe pattern at high power. Furthermore, these designs demand an increase in the fabrication complexity and have a greater sensitivity to fabrication and dimensional inaccuracies which occur during the fabrication process.

Another method offers laser arrays and broad stripe lasers that are injection locked using an external master laser to achieve both narrow single far field lobe emission and single longitudinal mode emission from laser arrays and from broad stripe lasers to powers of more than 500 milliwatts. See the above-referenced Goldberg et al. patent and Goldberg et al. papers. This method suffers a drawback because it requires a second laser and a high degree of temperature stability of two lasers.

Yet another method offers external cavity configurations comprising a spatial filter, a focusing lens, and a mirror which force an array to operate in a narrow far field lobe whereas without the cavity the array operates in a broad lobe. See Chang-Hasnein, C. J., et al., "High power with high efficiency in a narrow single lobed beam from a diode laser array in an external cavity", cited supra. Single lobe and multimode operation up to about 300 milliwatts have been observed. Still higher power is desired. The drawback of the latter technique is that it has not been demonstrated to be capable of achieving single lobe and high power at the same time, and does not result in a single longitudinal mode operation.

There is a manifest need to devise a high-power laser source which emits radiation in a diffraction-limited far field lobe. Such radiation can be collimated or focused into a diffraction-limited spot, as might be desired or required for coupling radiation into one or more single mode optical fibers, or collimated for free space beam propagation optical communications systems. A diffraction limited high-power laser diode source is also needed for second harmonic generation and nonlinear mixing of radiation generating optical wavelengths different than the source emission wavelengths. Furthermore, there is need for an external cavity arrangement which can be used to force a double lobe or a broad-lobe laser source to emit in a single mode while emitting in a narrow single diffraction limited far field lobe.

SUMMARY OF THE INVENTION

Objects of the Invention

An object of the invention is to provide a means for controlling a high-power laser so that it emits radiation in a diffraction limited far field distribution and emits radiation which can be focused into a diffraction limited spot.

Another object of the invention is to provide a ring laser in which the far field intensity distribution and spectra of a large area laser used as a source of radiation coupled into the ring laser is controlled via optical elements in the ring laser to assure diffraction limited and single longitudinal mode radiation from a large area laser which would ordinarily provide radiation without the wanted characteristics.

Still another object of the invention is to provide a ring laser to control the far field intensity distribution and spectra of a large area laser which may be a coupled-stripe laser diode array or a broad stripe laser diode.

Still another object of the invention is to provide a ring laser utilizing a source laser or a laser amplifier.

The invention relates to a ring laser using a large area laser as a source laser to emit and amplify radiation.

Optical elements in the ring cavity control the angular distribution of the radiation emitted by the large area laser by spatially filtering the source laser radiation propagating in the cavity then injecting a part of it back into the source laser. The rest of the spatially filtered radiation is made available for use outside the ring laser.

The invention provides ring lasers that use a large area laser having a wide optical cavity as a source laser, and use optical elements in an external cavity outside the optical cavity of a large area laser to form the output radiation from the large area laser into a desired output beam shape despite a tendency of the large area laser to form an undesired output beam shape.

The optical elements force a source laser to emit in a single mode and in a narrow single diffraction limited far field lobe pattern. These ring lasers have a Faraday rotator for rotating by 45 degrees the polarization of a beam of linearly polarized radiation. The Faraday rotator rotates the polarization of the radiation the same way (e.g. clockwise) regardless of which direction the radiation propagates through the rotator (e.g. right to left or left to right) and therefore is called a nonreciprocal element. On the other hand, a half-wave plate rotates the polarization by 45 degrees in opposite directions depending on radiation propagation directions.

Thus, when radiation passes through the Faraday rotator then through the half wave plate, the linear polarization direction is rotated by 45 degrees plus 45 degrees for a total of 90 degrees or is rotated by 45 degrees minus 45 for a total of 0 degrees depending on whether radiation propagates left to right or right to left through the rotator and the half-wave plate. Therefore, only radiation propagating in one direction will maintain the same polarization direction as the preferred direction of the source laser (parallel to the junction) and therefore will be amplified by the source laser when it is coupled back to the source laser. Radiation propagating in the opposite direction will experience a 90 degree polarization rotation and therefore will not be amplified by the source laser.

Hence, the Faraday rotator in conjunction with the source laser acts to allow only a single direction of propagation of radiation (light) in a ring cavity, wherein the optical elements are placed to return the radiation to the large area source laser in a way that forces the source laser to emit single diffraction limited lobe radiation even though the source itself is a broad lobe radiation source.

DESCRIPTION OF PREFERRED EMBODIMENTS OF THE INVENTION

Figure 1:
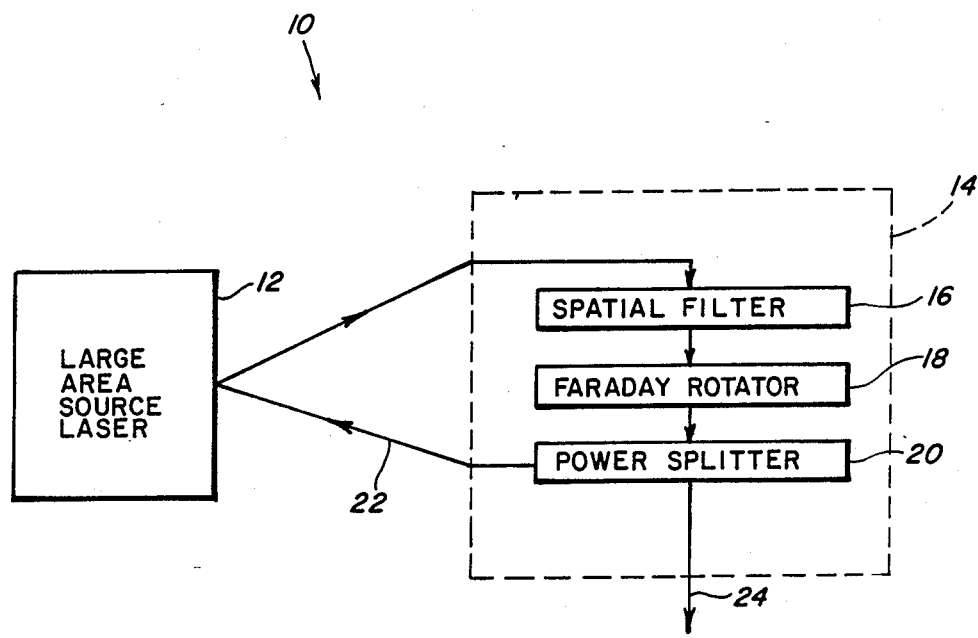
FIG. 1 shows a generalized block diagram of a ring laser employing a large area laser as a source laser and optical components, including a Faraday rotator, combined with the source laser.

FIG. 1 illustrates a ring laser 10 including a large-area source laser 12 optically coupled with an external cavity 14. Without the external cavity, source laser 12 would emit a wide pattern of polarized radiation with a wide-lobed far field distribution. Source laser 12 in ring laser 10 emits a wide diverging pattern of polarized radiation into cavity 14 of ring laser 10. External cavity 14 contains a series of optical components including a spatial filter 16, a Faraday rotator 18, and a power splitter 20. Elements 12, 14, 18, and 20 form a ring laser 10 in which radiation propagates ringwise in only one direction, indicated by (e.g. clockwise) direction arrows, because the rotator 18 is a component which causes the polarization of the radiation around a ring path to match the preferred orientation of the source laser and therefore undergo gain in only one direction around the ring path (e.g. clockwise).

Radiation 22 from source laser 12 passes through components 16, 18, and 20 in external cavity 14 then returns to source laser 12. Part of the radiation 22, indicated by an arrow 24, exits ring laser 10 via power splitter 20. The exit radiation is high-power radiation because ring laser 10 makes efficient use of radiation originated by a large area source laser 12.

Although FIG. 1 shows cavity 14 separate from the cavity of the source laser 12 it is possible to combine source laser 12 and cavity 14 into a two-part cavity containing both laser 12 and cavity 14. This is done simply by adding an antireflection coating of sufficiently small reflectivity to the emitting facet of source laser 12 to suppress source laser self-oscillation and create a laser amplifier structure.

Figure 2:
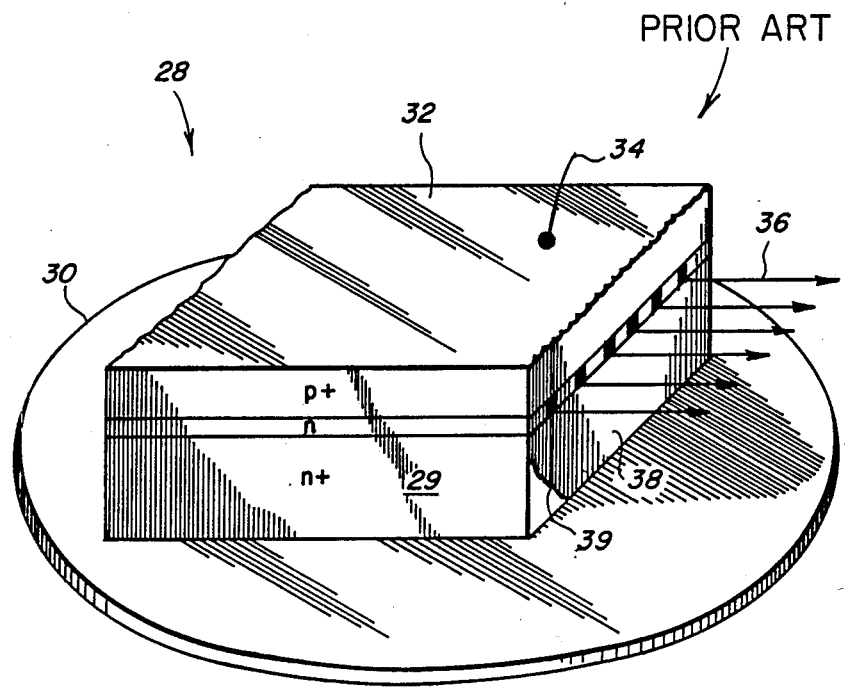
FIG. 2 shows a conventional coupled stripe laser diode array. The array is a large area laser which can be used as a source laser in a ring laser.
Figure 6:
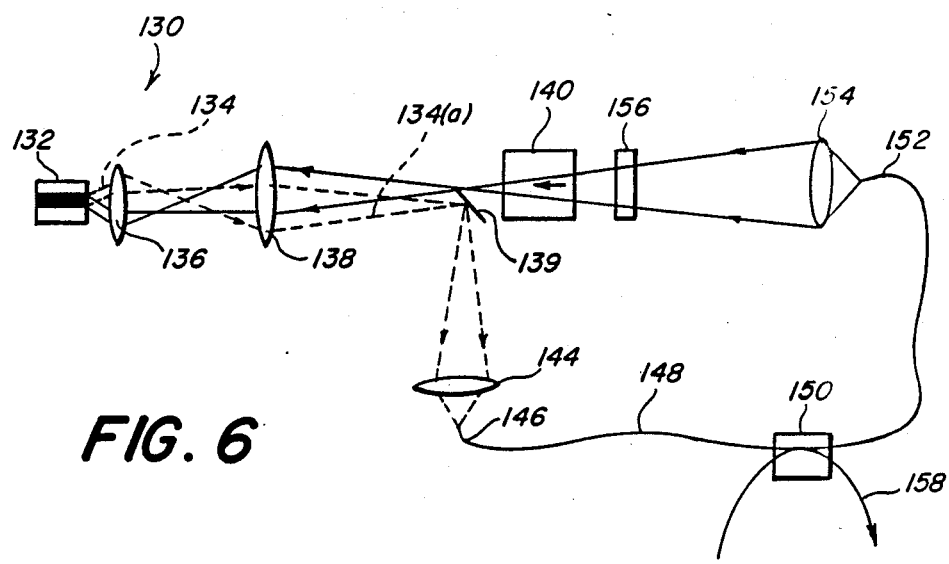
FIG. 6 shows a diagram of a ring laser forming an embodiment of the invention.
Figure 7A:
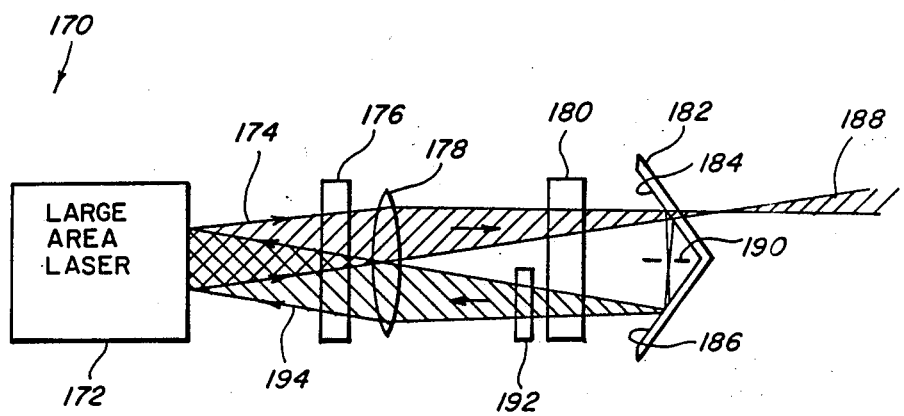
FIG. 7(a) shows a diagram of a plan view of a ring laser forming another embodiment of the invention.

FIG. 2 (labelled prior art) illustrates a typical coupled stripe laser diode array 28; a kind of large area laser that can be used in either of the exemplary ring lasers shown in FIG. 6 and in FIGS. 7(a) and (b). Coupled-stripe laser diode array 28 includes a slab of semiconductor material 29 sandwiched in a conventional manner between a bottom electrode 30 and a top electrode 32. Array 28 can be one of many commercially available arrays. Diode array SDL 2560, made by Spectra Diode Laboratory, or some other array, can be used.

A thin electrically conductive wire 34 bonded to top electrode 32 is used to apply a bias voltage to a planar p-n junction located in a horizontal plane in the slab. A planar array of narrow stripe lasers located crosswise of the junction is created in the slab due to biasing of the junction with the bias voltage. Forward biasing of the junction brings about the array-style lasing characterizing the described device. Coplanar stripe portions of the junction are laser active over a wide junction portion to emit wide patterned radiation 36 from a side facet 38 of the array-containing-slab.

The array-containing slab is made of GaAlAs, doped to include a p-n junction, or is made of any other suitable semiconductor material doped to include a p-n junction. The slab, typically, can be 300 microns long from left side to right side, 100 microns wide from front to back, and can contain many 300 micron long "emitter stripes" about 5 microns wide, spaced about 10 microns apart on a line running across the slab from the front to the back of the slab, as shown in FIG. 2, so that the ends of the "emitter stripes" are located at or near the left and right sides of the slab. Actual slab dimensions and "emitter stripe" dimensions are not critical dimensions. The stated dimensions merely exemplify arrays that produce narrow-stripe radiation when radiation exits a (e.g. rightmost side) facet, or plane surface, of the slab.

In the view of the slab shown in FIG. 2, the left side of the slab is coated with a thin layer (not shown) of reflective material that reflects radiation back into the slab when the radiation is incident on the coating from within the slab. The right side of the slab is bare (e.g. uncoated) or, alternatively, is antireflection coated to permit radiation 36 to exit from the slab via array facet 38. An optional antireflection coating 39, shown in FIG. 2, on facet 38 modifies the laser action in source laser 32. If the reflectivity is sufficiently low the cavity gain is not adequate to overcome the facet loss and lasing is suppressed thereby converting the array structure 28 into an optical amplifier. Radiation 36, as broadly indicated by arrows representing radiation from a collection of single, laterally spaced, "emitter stripes" in an array of "emitter stripes" laid lengthwise in side by side relation across the laser active area of the array.

In FIG. 2, top electrode 32 has a wavy surface because it covers a striped pattern of dielectric film (e.g. silicon dioxide) stripes on the top slab surface. Top electrode 32 contacts the slab at uniformly spaced intervals through a series of long, narrow slots formed by neighboring stripes of dielectric film. The electrode material in these slots are vertically aligned with the "emitter stripes" in the active region near the p-n junction.

The slab has typically at least three layers. The layers, from top to bottom, are a p+ layer, an n layer, and an n+ layer. The p+ and n layers form the planar p-n junction and contain a transition region bridging the p-n junction where radiation is generated in a wide active area through lasing action. Dark stripes (not labelled) within this area indicate where the lasing portions of the p-n junction are located; below the stripes of electrode material contacting the flat, top surface of the slab.

Figure 3:
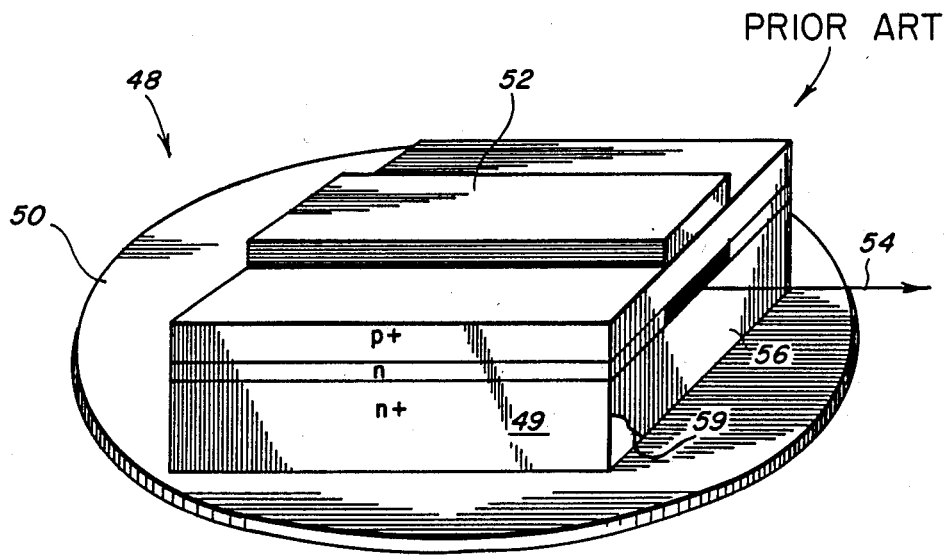
FIG. 3 shows a conventional broad stripe laser diode. The diode is a large area laser which can be used as a source laser in a ring laser.
Figure 7B:
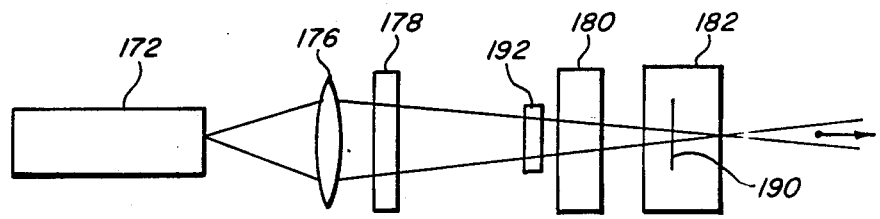
FIG. 7(b) shows a diagram of an side view of the ring laser shown in FIG. 7(a).

FIG. 3 (labelled prior art) shows a broad-stripe laser diode 48; a kind of large area laser which can be used in the ring lasers shown in FIGS. 6 and 7(a)-7(b). SLD 304 W broad stripe laser diode, made by Sony Corp. of America can be used as diode 48, or some other broad stripe laser diode may be used. Diode 48 includes a slab of semiconductor material 49, a bottom electrode 50 and a top electrode 52 sandwiching semiconductor slab 49 between them. Top electrode 52 is a wide stripe electrode.

The slab contains a planar p-n junction bridged by a horizontally oriented transition region containing a laser active region located beneath top electrode 52. The slab contains a p+ layer, an n layer, and an n+ layer, with the P+ and n layers forming the p-n junction. Wide shaped radiation 54 originates through lasing action in the thin active region when a forward bias voltage is applied to the junction.

Top electrode 52 overlies a central portion of the slab bulk to contact a wide slab surface area vertically aligned with the active region (area). A wide and long opening (not shown) in a dielectric film (not shown) of silicon dioxide, or of some other dielectric material, covering the top of the slab is filled with electrode material and allows electrode 52 to contact the slab above the middle portion of transition region where the laser active area forms a broad "emitter stripe" 54 of radiation.

Radiation 54 exits the plane surface 56 at the right side of the slab in a wide single lobe pattern, indicated generally by a single radiation arrow. Radiation 54 leaves facet 56 in a wide spatial pattern near the facet (the near field) that has a wide lobe far field diffraction pattern. Radiation 54 assumes a far field distribution as the radiation travels further away from the slab.

An optional antireflection coating 59, shown in FIG. 3, on facet 56 modifies the laser action in source laser 48. If the reflectivity is sufficiently low the cavity gain is not adequate to overcome the facet loss and lasing is suppressed. As a result, the emitted beam disappears and the source laser becomes an optical amplifier.

Figure 4:
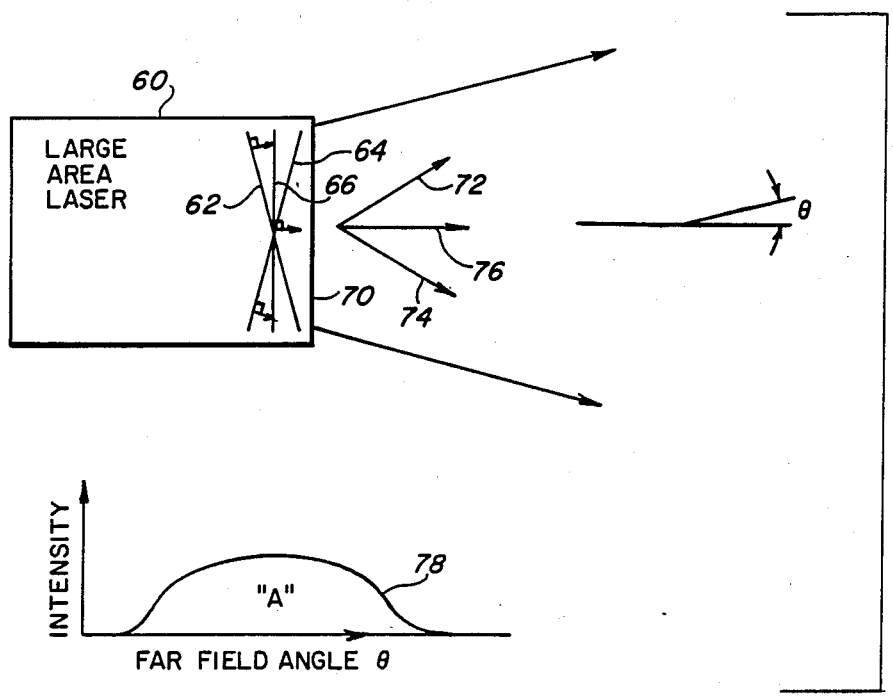
FIG. 4 is a sketch showing the wide far field lobe operation of the laser diode array shown in FIG. 2.
Figure 5:
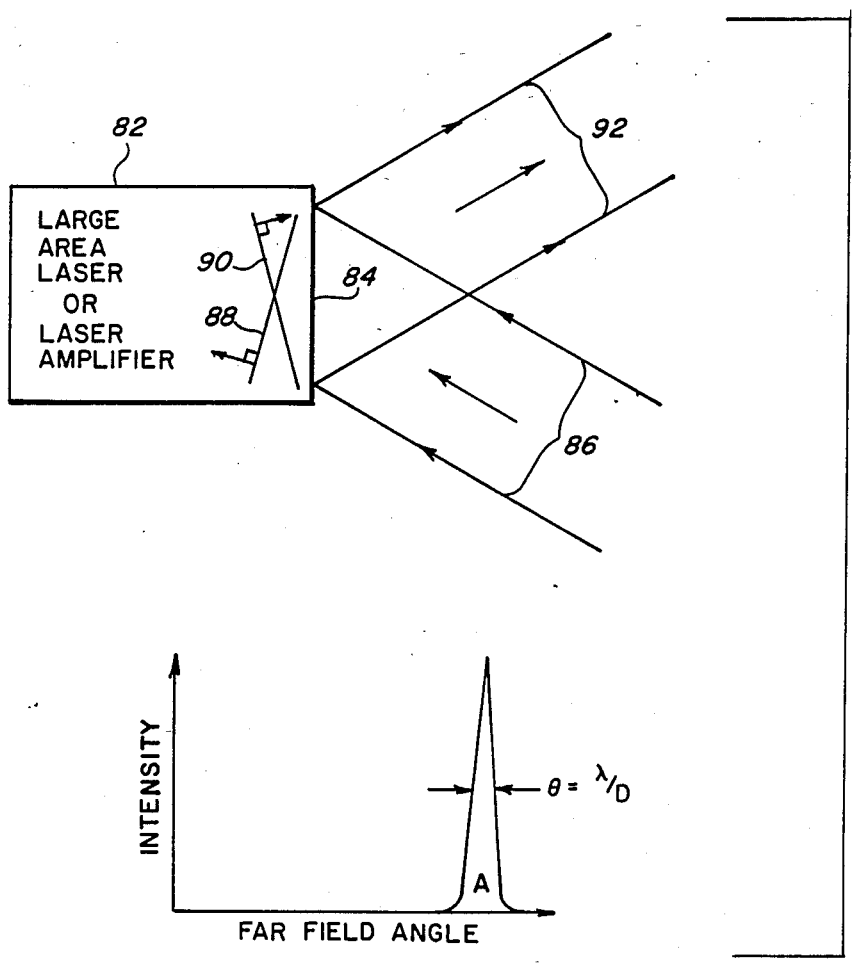
FIG. 5 is a sketch of the narrow far field lobe operation of a large area laser when operated in conjunction with an external ring laser cavity.

FIGS. 4 and 5 illustrate fundamental principles of the invention.

FIG. 4 shows a schematic view of a large area laser 60 wherein three radiation planewaves 62, 64, and 66 travelling from right to left in the bulk of a slab forming a wide laser cavity are represented by three lines intersecting at a common point, and by tiny direction arrows indicating three planewave propagation angles for these three planewaves. Multiplicity of planewave propagation angles in laser 60 is the norm, and although only partially illustrated in FIG. 4 should be understood. Planewaves exiting slab facet 70 propagate into the near field in directions in a range of propagation angles represented by direction arrows 72, 74, and 76.

The far field angle $\theta$ shown to the left of array 60 is measured with respect to a line normal to facet 70.

A graph of beam intensity versus far field angle $\theta$ in the plane parallel to the semiconductor junction plane of large area laser 60 used as the source laser is shown in FIG. 4 and indicates that beam energy in a beam leaving laser 60 spreads out over a wide range of far field angles corresponding to many possible planewave propagation directions. The area "A" under intensity vs. far field angle curve 78 is proportional to the beam power. This graph indicates broad lobe far field emission which as described earlier can not be focused into a diffraction limited spot small enough to pass through a small aperture, such as the core of a thin optical fiber. In the direction orthogonal to the semiconductor junction plane of the source laser, the emission region is very narrow and the radiation pattern is like that of a point source. The pattern can be focused into a diffraction limited spot.

FIG. 5 shows a large area laser 82 having a facet 84 and the effect of injecting an external beam 86 into the laser 82. External beam 86 approaches the wide laser cavity at an angle to the normal to the plane of cavity facet 84. External beam 86 comes from an external cavity outside of the wide cavity of source laser 82. External beam 86 arrives at facet 84 where beam 86 couples into the laser cavity. Radiation represented by a tilted planewave 88 propagates from right to left at an angle to the normal to the plane of cavity facet 84. Planewave 88 is reflected back and forth between cavity ends at the leftmost and rightmost facets of source laser 82 and is amplified in the laser cavity.

After amplification of planewave 88, there will exist an amplified planewave 90 which is incident on the laser facet 84 at a tilt angle measured from the normal to the plane of the facet 84. Therefore the laser amplifies the injected beam. The angles of planewaves 88 and 90 are symmetrical about the axis normal to facet 84.

On exiting the cavity via facet 84 the planewave 90 and successive planewaves become a high power beam 92 leaving facet 84 at a tilt angle symmetrical to the tilt angle of input beam 86. In the presence of an injected beam 86, all planewave directions other than the one shown for planewave 90 are suppressed, due to a decrease in cavity gain caused by injected beam 86. Therefore, output beam 92 propagates in a single planewave direction 94 indicated by a direction arrow. A narrow, diffraction-limited lobe far field distribution of the propagated beam is the result. This result hallmarks the invention. How this result can be, and is, achieved is described later, with reference to FIGS. 6 and 7(a)–(b). The injected beam does not affect the source laser radiation pattern in the direction orthogonal to the junction.

The ring cavity laser will still operate in the desired manner if the laser amplifier provides sufficient gain for the injected beam to overcome optical losses in the ring laser cavity. Under this condition lasing action (oscillation) in the ring cavity can be sustained.

A graph of radiation intensity versus far field angle $\theta$ in the plane parallel to the junction is shown in FIG. 5 where the area "A" under the intensity vs. far field angle represents the beam energy. The area "A" in FIG. 5 equals the area "A" in FIG. 4, signifying preservation of beam power achieved while practicing the invention. The (FIG. 5) graph indicates that $\theta =$ lambda/D where lambda=wavelength and D= distance from laser facet 84. Comparison of the narrow far field angle $\theta$ shown in FIG. 5 with the wide far field angle $\theta$ shown in FIG. 4 indicates that the intensity of radiation shown in FIG. 5 is greater in the center of the far field than the intensity of radiation shown in FIG. 4. The two graphs are not drawn to scale. The two graphs although not drawn to scale allow comparisons to be drawn in explaining the results achievable in practicing the invention.

FIGS. 6 and 7(a)–(b) will now be described with reference to particular embodiments of the invention wherein the teachings set forth above come into play.

FIG. 6 shows schematically a novel ring laser 130 that forms a preferred embodiment of the invention. In ring laser 130, a source laser 132 is employed. Source laser 132 is a large area laser (e.g. a broad-stripe laser or a laser array) such as either one of the lasers illustrated in FIGS. 2 and 3. Laser diodes such as the source laser 132 emit and amplify only radiation which is linearly polarized parallel to the semiconductor junction (vertical direction in FIG. 6).

Source laser 132, shown in FIG. 6, lases to emit a broad-lobed beam of which a small angular portion is indicated by paired dashed lines 134. Beam 134 passes through a first lens 136, then passes through a second lens 138 which is cylindrical and becomes beam 134 (a), and is focused by the two lenses onto a mirror 139. When ring laser 130 operates, the part of the output beam at the large area laser 132 which lies outside of the angular range indicated by the dashed lines 134 is suppressed.

Mirror 139 directs beam 134 (a) toward a focusing lens 144 which couples light into one end 146 of a thin, single mode fiber 148 of chosen length. Mirror 139 is a means for routing an angular portion 134 (a) of the wide pattern of polarized radiation of beam 134 in a predetermined direction.

Fiber 148 carries the beam from fiber end 146 to and through a fiber optic coupler 150 to another fiber end 152.

A focusing lens 154 located near fiber end 152 intercepts the beam from fiber end 152, and then focuses it through a half-wave plate 156 and a Faraday rotator 140. When the beam passes through the half-wave plate 156 its polarization (the output beam polarization of the source laser 132) is in the plane of the junction (i.e. vertical in FIG. 6) is rotated by 45 degrees clockwise, while rotator 140 rotates it 45 degrees counterclockwise so that the total rotation is 0 degrees and therefore the beam, after passing through lenses 138 and 136, is then injected into large area laser 132 with polarization parallel to the junction, allowing for maximum amplification (gain) in the source laser cavity. The injected beam (not labelled) is represented by paired solid lines drawn between lens 154 and source laser 132.

The routing means 139 and the Faraday rotator 140 and the half-wave plate 156 in conjunction with the source laser 132 allow radiation to propagate in only one direction in the ring laser cavity by causing the beam polarization in that direction to be correct for maximum amplification by the source laser 132, while causing the beam polarization to be such that it allows minimum gain for radiation propagating in the ring cavity in the opposite direction to the one direction. Propagation in a single direction assures that ring laser cavity output power emerges from only one of the output coupler ports.

Optical fiber 148 acts as a spatial filter, allowing laser 132 to emit in only a narrow angular range of planewave directions since only planewaves propagating in these directions are coupled through fiber 148 and injected into the laser cavity via rotator 140. Faraday rotator 140 located between lens 154 and lens 138 assures that the external cavity supports optical oscillation in only one direction (i.e. counterclockwise) since it is only in that direction that the beam is amplified by the source laser.

The routing means 139 acts to couple part of the radiation from the source laser into the ring so that the coupled radiation passes through Faraday rotator 180 and spatial filter 148 and half-wave plate 156 and is injected into source laser 132 to assure emission of radiation in a narrow far field distribution by the source laser as a result of suppression of the broad lobed radiation of the polarized radiation emitted by source laser 132 by the injected radiation pattern.

FIGS. 7(a) and 7(b) show schematically two orthogonally related views of a ring laser 170 forming another embodiment of the invention. FIGS. 7(a) and 7(b) afford top and side views of a large area laser 172 used as a source laser. FIG. 7(a) affords a top view of laser 172 wherein a horizontal plane contains a laser p-n junction such as the junction described with reference to FIG. 3. Source laser 172 is considered to be a broad-stripe laser like the one described with reference to FIG. 3. Source laser 172 could be a multiple stripe laser array like the one described with reference to FIG. 2. Significantly, source laser 172 like source laser 132 (FIG. 6) emits and amplifies only radiation polarized parallel to the junction plane.

A laser beam 174 emerging from laser 172 passes successively through two cylindrical lenses 176 and 178 and then passes through a Faraday rotator 180. Beam 174 next reaches a conventional right angle retroflector 182 having two mirrors set at a right angle to each other. Beam 174 is reflected by one mirror side 184 then by another mirror side 186. Side 184 is partly transparent (partly reflective) so that some of the beam energy couples out of ring laser 170 via an external cavity formed by ring laser components located to the right of source laser 172. This beam energy is useful output energy carried by a beam 188. Alternative output coupling means could also be used, for example, a beamsplitter could be placed into the ring cavity between the source laser and the retroflector. In addition, frequency selective components such as gratings or etalons could be placed within the cavity to help narrow the spectral linewidth of the emission.

A spatial filter 190 placed near retroflector 182 in a plane bisecting the angle between the two mirrored sides of the retroflector filters beam energy reflected by mirror side 184 toward filter 190. Spatial filter 190 can be a small aperture in a thin opaque sheet. Filter 190 allows only output beam planewaves within a small angular range to pass through the filter aperture, allowing only a small angular deviation in the injected beam that ultimately reaches source laser 172. A nearly collimated injected beam results when radiation emerging from filter 190 reflects from retroflector mirror side 186 and then passes through the two cylindrical lenses 178 and 176 to reach source laser 172.

Retroflector 182 is located so that radiation passes through one side of Faraday rotator 180, is laterally shifted and reflected by retroflector 182, and then passes through another side of Faraday rotator 180 to pass twice through Faraday rotator before being injected into source laser 132.

Faraday rotator 180 is chosen to have a proper length so that it rotates the linear polarization of output beam 174 from source laser 172 by 22.5 degrees per pass so that the beam polarization is rotated clockwise by a total of 45 degrees after two passes as shown.

A half wave plate 192 is inserted between part of rotator 180 and part of cylindrical lens 178, so that the injected beam polarization is rotated by half wave plate 192 by 45 degrees counterclockwise so that the polarization of the beam incident on the large area source laser is parallel to the junction plane of source laser 172 as required for high gain.

The injected beam, labelled 194, is distinguished from laser beam 174 by directional lines indicating that beam 172 exits and beam 194 returns to source laser 172 via nonparallel paths. The counterclockwise direction of light in the ring cavity is suppressed since rotator 180 and half wave plate 139 each rotate the beam polarization by 45 degrees in the clockwise direction for a total of 90 degrees, so that the source laser does not amplify light traveling in the counterclockwise direction.

In FIGS. 7(a) and 7(b) the rotator 180, spatial filter 190, and partly transparent mirror side 184 (i.e. power splitter 184) are analogous to the rotator 140, spatial filter 148 (i.e. optical fiber 148), and power splitter 150 shown in FIG. 6 except that the order of elements in their respective lasers is somewhat different.

It should be realized that the source lasers as described can have an antireflectance coating on the facet where the source lasers emit radiation and that these coatings if made of sufficiently low reflectivity would prevent lasing action in the source lasers and convert them into optical amplifiers. The ring cavity laser can operate in the same manner with either a source laser or a source amplifier since the function of providing gain for the injected beam can be fulfilled by either one of these devices.

The chief advantage of the invention is that the external cavity arrangements of FIGS. 6, 7(a) and 7(b) force the large area laser to operate in its highest gain condition thereby allowing single lobe output at high output powers. In the ring external cavities described hereinbefore the planewave direction is tilted so that the planewave experiences higher internal optical gain than it would if the planewave direction was parallel to the output facet of the source laser. This higher gain makes it possible to achieve single lobe operation at higher powers than with previous techniques. Furthermore, narrow far field lobes are achieved by spatially filtering the injected beam so that only a very narrow angular range of planewaves is allowed to be injected into the cavity on return of radiation to the cavity.

While the invention has been shown and described with reference to particular embodiments of the invention, it will be understood by those skilled in ring laser technology that various changes and modifications may be made thereto without departing from the spirit and scope of the invention which is meant to be limited only by the scope of the claims annexed hereto.

We claim:

1. A ring laser, comprising:
a cavity;
a source laser emitting a wide diverging pattern of polarized radiation into the cavity of the ring laser, the source laser being a device that is effective to emit a wide pattern of polarized radiation with a wide-lobed far field distribution;
routing means located in the cavity near the source laser for routing an angular portion of the wide pattern of polarized radiation in a predetermined direction;
a Faraday rotator for rotating polarization direction of radiation;
the Faraday rotator being located in the cavity of the ring laser;
a half-wave plate for rotating polarization direction of radiation;
the half-wave plate being located in the cavity of the ring laser;
the routing means and the Faraday rotator and the half-wave plate being located in an optical ring path in the cavity so that radiation can propagate around the path and pass from the routing means to and through the Faraday rotator and to and through the half-wave plate;
the routing means and the Faraday rotator and the half-wave plate in conjunction with the source laser allowing radiation to propagate in only one direction in the ring path in the cavity by causing the radiation polarization in that direction to be correct for maximum amplification by the source laser when the polarized radiation is routed from the routing means to the source laser via the Faraday rotator and the half-wave plate, while causing the radiation polarization to be such that it allows minimum gain for radiation propagating in the ring path in the cavity in the opposite direction to the one direction;
optical means including a spatial filter and a power splitter located along the ring path to filter polarized radiation propagating along the ring path and to split radiation from the radiation propagating in the ring path;
the Faraday rotator, the spatial filter, and the power splitter being located along the ring path being arranged in serial fashion so that radiation routed from the source laser by the routing means can return to the source laser after passing through the spatial filter, the power splitter, and the Faraday rotator;

the Faraday rotator rotating the polarization of the radiation emitted by the laser source and assuring propagation of the radiation in the one direction around the ring path because the polarized radiation on passing through the Faraday rotator changes its polarization direction so that on returning to the source laser the polarized radiation returning to the source laser has a polarization matching the polarization of the radiation emitted by the source laser;

the power splitter being located on the ring path where the power splitter serves as a radiation coupling means for coupling some of the radiation out of the ring path while passing some of the radiation along to the source laser;

the radiation passing through the Faraday rotator and the spatial filter and the half-wave plate being injected into the source laser with a polarization that assures emission of radiation in a narrow far field lobe by the source laser as a result of suppressing broad lobed radiation of the polarized radiation emitted by the source laser through interaction of the injected radiation with the source laser.

2. The ring laser of claim 1 wherein the source laser is selected from the group consisting of a coupled-stripe laser diode array and a broad-stripe laser diode.

3. The ring laser of claim 2 further comprising at least one lens located between the Faraday rotator and the source laser for focusing polarized radiation from the source laser onto the routing means.

4. The ring laser of claim 2 wherein the routing means comprises at least one lens located between the Faraday rotator and the source laser for focusing polarized radiation from the source laser onto the half-wave plate and the Faraday rotator.

5. The ring laser of claim 2 further comprising one lens focusing radiation onto the spatial filter and where another lens focusing radiation from the spatial filter onto the half-wave plate.

6. The ring laser of claim 5 wherein the spatial filter is an optical fiber located between the aforesaid lenses to carry radiation between the lenses.

7. The ring laser of claim 2 further comprising a pair of lenses located on both sides of the spatial filter where one part of the pair of lenses focus radiation onto the Faraday rotator and where another part of the same lenses focus radiation onto the source laser after the radiation passes through the Faraday rotator.

8. The ring laser of claim 2 wherein the half-wave plate is located between the spatial filter and the Faraday rotator to rotate the polarization of radiation before the radiation passes through the Faraday rotator and returns to the source laser.

9. The ring laser of claim 2 wherein the half-wave plate is located between the Faraday rotator and the source laser to rotate the polarization of radiation passing through the Faraday rotator before the radiation returns to the source laser.

10. The ring laser of claim 1 wherein the power splitter comprises a retroflector located in the ring path in such relation to the Faraday rotator that some radiation passes through one side of the Faraday rotator and some radiation is reflected, laterally shifted and and reflected again by the retroflector, the twice-reflected radiation then passing through another side of the Faraday rotator to pass twice through the Faraday rotator.

11. The ring laser of claim 2 wherein the power splitter is a single mode fiber coupler and wherein the fiber coupler is located along the spatial filter which is an optical fiber.

12. The ring laser of claim 2 wherein the power splitter is located between the Faraday rotator and the spatial filter and wherein the power splitter is a partially reflective coating on one side of a retroflector that laterally shifts and reflects radiation incident on the partially reflective coating toward the source laser.

13. The ring laser of claim 1 wherein the source laser is a large area laser containing a planar p-n junction and wherein the half-wave plate and the Faraday rotator rotate the polarization of the radiation passing through them to make the radiation propagating toward the source laser to be polarized parallel to the planar p-n junction.

14. The ring laser of claim 1 further comprising:
an antireflection coating on the source laser to suppress self oscillation of the source laser.

15. The ring laser of claim 1 wherein the spatial filter is selected from the group consisting of an optical fiber and an aperture in an opague sheet.

16. The ring laser of claim 1 wherein the source laser is a large area laser.

17. The ring laser of claim 16 wherein source laser contains a junction plane and wherein the Faraday rotator and the half-wave plate rotate polarized radiation from the source laser to assure that the radiation is parallel to the junction plane when the radiation is injected into the source laser, thereby assuring amplification of the injected radiation by the source laser.

18. A ring laser having a ring laser cavity, the ring laser comprising;
a laser amplifier;
a Faraday rotator;
a half-wave plate;
a power splitter;
a spatial filter;
a lens system;
means for coupling part of the radiation beam from the laser amplifier into the ring laser cavity via the spatial filter so that the Faraday rotator returns the radiation to the laser amplifier;
the Faraday rotator and the half-wave plate being located in a field where in conjunction with the laser amplifier, the power splitter, the spatial filter, and the lens system they assure that power flow is in only one direction in a ring laser cavity;
The Faraday rotator being located along a path forming a ring defined by the half-wave plate, the spatial filter, and the lens system by which radiation emerging from the laser amplifier can return to the laser amplifier after passing through the power splitter and the Faraday rotator;
the Faraday rotator changing the polarization direction of the radiation and assuring propagation of the radiation in a single direction along said ring;
means for coupling part of the radiation beam from the laser amplifier into the ring via the spatial filter so that the Faraday rotator in the ring returns the radiation to the laser amplifier.

19. The ring laser of claim 18 wherein the amplifier is selected from the group consisting of a coupled-stripe laser diode array and a broad-stripe diode optical amplifier structure.

20. A ring laser system comprising:
   laser means for generating a laser output;
   feedback means for transmitting a feedback signal to said laser means, said feedback signal being at least a single mode of a portion of said laser output, said laser means becoming injection locked as a result of transmitting said feedback signal.

21. The system of claim 20, wherein said laser means has at least one planar laser facet, and said feedback means is effective to cause said feedback signal to be transmitted to said laser means linearly polarized substantially parallel to said planar laser facet.

22. The system of claim 21, wherein said feedback means comprises a single mode optical fiber, a half wavelength plate, and a Faraday rotator; and wherein:
   said single mode optical fiber transmits said feedback signal, and said Faraday rotator and said half wavelength plate are adapted to cooperate, responsive to said feedback signal transmitted by said fiber, to cause the polarity of said feedback signal to be substantially parallel to said planar laser facet.

23. A ring laser system comprising:
   laser means for generating a laser output, said laser means having at least one planar laser facet;
   feedback means for transmitting a feedback signal to said laser means, said feedback means comprising a Faraday rotator, a retroreflector, and a half wavelength plate, said feedback signal being at least a portion of said laser output, said laser means being selected to become injection locked responsive to said feedback signal, and wherein:
   said Faraday rotator, said retroreflector and said half wavelength plate cooperate with one another to cause the polarity of said feedback signal to be substantially parallel to said planar laser facet.

* * * * *